(12) United States Patent
Wang

(10) Patent No.: US 11,649,534 B2
(45) Date of Patent: May 16, 2023

(54) COMPOSITE ALUMINUM ALLOY PLATE FOR A CASE OF AN ELECTRONIC PRODUCT

(71) Applicant: Huang-Chieh Metal Composite Material Tech. Co., Ltd., New Taipei (TW)

(72) Inventor: Chin-Han Wang, New Taipei (TW)

(73) Assignee: HUANG-CHIEH METAL COMPOSITE MATERIAL TECH. CO., LT, New Taipei (TW)

( * ) Notice: Subject to any disclaimer, the term of this patent is extended or adjusted under 35 U.S.C. 154(b) by 404 days.

(21) Appl. No.: 16/829,461

(22) Filed: Mar. 25, 2020

(65) Prior Publication Data

US 2021/0301382 A1    Sep. 30, 2021

(51) Int. Cl.
| | | |
|---|---|---|
| *C22F 1/04* | (2006.01) | |
| *H05K 5/04* | (2006.01) | |
| *B21B 3/00* | (2006.01) | |
| *C22C 21/00* | (2006.01) | |

(52) U.S. Cl.
CPC .................. *C22F 1/04* (2013.01); *B21B 3/00* (2013.01); *C22C 21/00* (2013.01); *H05K 5/04* (2013.01)

(58) Field of Classification Search
CPC .. B21B 3/00; C22C 21/00; C22F 1/04; H05K 5/04
USPC .......................................................... 420/528
See application file for complete search history.

(56) References Cited

U.S. PATENT DOCUMENTS

| | | | |
|---|---|---|---|
| 5,723,221 A * | 3/1998 | Brooker ................. | B32B 15/016 428/629 |
| 10,285,294 B2 * | 5/2019 | Yanagisawa ............ | H05K 5/00 |
| 2017/0173742 A1 * | 6/2017 | Matsumoto ........... | B32B 15/016 |

\* cited by examiner

*Primary Examiner* — Jie Yang
(74) *Attorney, Agent, or Firm* — Chun-Ming Shih; Lanway IPR Services

(57) ABSTRACT

A composite aluminum alloy plate for a case of an electronic product contains: a first aluminum alloy plate and a second aluminum alloy plate. The first aluminum alloy plate is made of first aluminum alloy material, and the second aluminum alloy plate is made of second aluminum alloy material. The first aluminum alloy material is selected from any one of 6XXX series aluminum alloy to 8XXX series aluminum alloy, and the second aluminum alloy material is selected from any one of 1XXX series aluminum alloy to 5XXX series aluminum alloy. The first and second aluminum alloy plates are stacked and compounded by hot rolling so as to produce the composite aluminum alloy plate having an external layer, an intermediate layer, and an internal layer. Thereafter, the composite aluminum alloy plate is laminated by cold rolling and is stabilized in a tempering treatment.

4 Claims, 3 Drawing Sheets

COMPOSITE ALUMINUM ALLOY PLATE FOR A CASE OF AN ELECTRONIC PRODUCT

FIELD OF THE INVENTION

The present invention relates to an aluminum alloy plate, and more particularly to a composite aluminum alloy plate and a method of making the same for a case of an electronic product.

BACKGROUND OF THE INVENTION

A conventional case of a smart phone is made of aluminum alloy based on material codes which represent different mechanical strength and property, for example, 1XXX series aluminum alloy has lowest pure aluminum strength, and 7XXX series aluminum alloy has highest pure aluminum strength. The material codes is ruled by The Aluminium Association (AA).

The case is made from aluminum alloy, is surface anodized, and is color processed, wherein when the case is surface anodized, an oxide film is formed on the aluminum alloy by ways of electric currents, thus obtaining rich color, brilliant electrical insulation, high hardness, and corrosion resistance. The oxide film is dyed in by sulfuric acid anodizing.

As it is desired to oxidize the oxide film in transparent, the aluminum alloy is 5XXX series aluminum alloy or 6XXX series aluminum alloy so as to dye the oxide film.

5XXX series aluminum alloy, called as "aluminum-magnesium alloy", is a widely used because it's high corrosion resistance and weldability. The 5XXX series aluminum alloy can be anodized, but when a content of magnesium is high, a brightness of the 5XXX series aluminum alloy is poor.

The aluminum alloy is stamped to obtain high mechanical strength. However, when aluminum alloy is the 5XXX series aluminum alloy or the 6XXX series aluminum alloy, it is surface anodized and is dyed to achieve aesthetic appearance but has poor mechanical strength.

For instance, a case of iPhone 6 is made of the 6XXX series aluminum alloy and it is twisted or bends easily. To overcome such a problem, iPhone 6s is made of 7XXX series aluminum alloy, yet it has a thin oxide layer after being anodized, thus causing poor abrasion resistance.

The present invention has arisen to mitigate and/or obviate the afore-described disadvantages.

SUMMARY OF THE INVENTION

The primary objective of the present invention is to provide a composite aluminum alloy plate for a case of an electronic product in which the first aluminum alloy material of the first aluminum alloy plate is selected from any one of the 6XXX series aluminum alloy to the 8XXX series aluminum alloy so as to enhance mechanical strength of the case of the electronic product, and the second aluminum alloy plate is the external layer of the composite aluminum alloy plate, the second aluminum alloy material of the second aluminum alloy plate is selected from any one of the 1XXX series aluminum alloy to the 5XXX series aluminum alloy, then the second aluminum alloy plate is anodized and dyed so as to enhance aesthetic appearance of the case of the electronic product.

A secondary objective of the present invention is to provide a composite aluminum alloy plat for a case of an electronic product which is stamped to enhance a quality of right-angled sides of the case of the electronic product.

A further objective of the present invention is to provide a composite aluminum alloy plat for a case of an electronic product which is anodized and is dyed to enhance aesthetic appearance of the case of the electronic product.

Another objective of the present invention is to provide a composite aluminum alloy plat for a case of an electronic product in which the hardness of the second aluminum alloy plate is up to 6XXX series aluminum alloy so as to obtain chemical stability, insulation, high-temperature resistance, and abrasion resistance.

To obtain above-mentioned objectives, a heat transfer RFID tag for a fabric provided by the present invention contains: a substrate; a transfer pattern layer printed on a face of the substrate; an antenna printed on the transfer pattern layer; a chip electrically connected with the antenna; and a transfer glue layer coated on a side of the face of the substrate, and the transfer glue layer partially or completely covers the transfer pattern layer, the antenna, and the chip.

A composite aluminum alloy plate for a case of an electronic product contains: a first aluminum alloy plate and a second aluminum alloy plate which are stacked and compounded, the first aluminum alloy plate is made of first aluminum alloy material, and the second aluminum alloy plate is made of second aluminum alloy material different from the first aluminum alloy material of the first aluminum alloy plate.

The first aluminum alloy material of the first aluminum alloy plate is selected from any one of 6XXX series aluminum alloy to 8XXX series aluminum alloy, and the second aluminum alloy material of the second aluminum alloy plate is selected from any one of 1XXX series aluminum alloy to 5XXX series aluminum alloy.

The first aluminum alloy plate and the second aluminum alloy plate are stacked and compounded by hot rolling so as to produce the composite aluminum alloy plate having an external layer, an intermediate layer, and an internal layer, and the composite aluminum alloy plate is laminated in a desired thickness by cold rolling and is stabilized in a tempering treatment T.

The first aluminum alloy plate is the intermediate layer of the composite aluminum alloy plate, the second aluminum alloy plate is the external layer of the composite aluminum alloy plate, and a ratio of thicknesses of the intermediate layer and the external layer is 1 to 9:1.

The second aluminum alloy plate includes an anodized aluminum layer anodized on an outer surface thereof.

A method of making a composite aluminum alloy plate for a case of an electronic product contains steps of:

providing materials, wherein first aluminum alloy material of a first aluminum alloy plate and second aluminum alloy material of a second aluminum alloy plate are provided, wherein the first aluminum alloy material is selected from any one of the 6XXX series aluminum alloy to the 8XXX series aluminum alloy, and the second aluminum alloy material is selected from any one of the 1XXX series aluminum alloy to 5XXX series aluminum alloy;

hot rolling, wherein the first aluminum alloy plate and the second aluminum alloy plate are stacked and compounded by hot rolling to produce the composite aluminum alloy plate having an external layer, an intermediate layer, and an internal layer, wherein the first aluminum alloy plate is the intermediate layer of the composite aluminum alloy plate, and the second aluminum alloy plate is the external layer of the composite aluminum alloy plate;

cold rolling, wherein the composite aluminum alloy plate is laminated in a desired thickness by cold rolling, and a ratio of thicknesses of the intermediate layer and the external layer is 1 to 9:1;

stabilizing the composite aluminum alloy plate P in a tempering treatment T; and anodizing the second aluminum alloy plate so as to produce an aluminum layer on an outer surface of the second aluminum alloy plate.

Preferably, the desired thickness of the composite aluminum alloy plate is 0.1 mm to 6.0 mm, a total elongation of the composite aluminum alloy plate is 5% to 25%, a tensile strength of the intermediate layer is 300 Mpa to 550 Mpa, and a tensile strength of the external layer is 100 Mpa to 150 Mpa.

Preferably, the first aluminum alloy plate is 7075 aluminum alloy plate, and the second aluminum alloy plate is 5052 aluminum alloy plate; wherein the desired thickness of the composite aluminum alloy plate is 0.1 mm to 6.0 mm, a total elongation of the composite aluminum alloy plate is 5% to 25%, a tensile strength of the intermediate layer is 300 Mpa to 550 Mpa, and a tensile strength of the external layer is 100 Mpa to 150 Mpa.

Preferably, the tempering treatment T is a refining treatment T6 by which the composite aluminum alloy plate is hot rolled, cold rolled, and solution treated in the temperature of 480° C. to 520° C., and the composite aluminum alloy plate is aging treated for 24 hours within the temperature of 110° C. to 130° C.

Preferably, a ratio of thicknesses of the intermediate layer and the external layer is 1 to 2:1.

A method of making a composite aluminum alloy plate for a case of an electronic product contains steps of:

providing first aluminum alloy material of a first aluminum alloy plate and second aluminum alloy material of a second aluminum alloy plate, wherein the first aluminum alloy material is selected from any one of the 6XXX series aluminum alloy to the 8XXX series aluminum alloy, and the second aluminum alloy material is selected from any one of the 1XXX series aluminum alloy to 5XXX series aluminum alloy;

hot rolling, wherein the first aluminum alloy plate and the second aluminum alloy plate are stacked and compounded by hot rolling to produce the composite aluminum alloy plate having an external layer, an intermediate layer, and an internal layer, wherein the first aluminum alloy plate is the intermediate layer of the composite aluminum alloy plate, and the second aluminum alloy plate is the external layer of the composite aluminum alloy plate;

cold rolling, wherein the composite aluminum alloy plate is laminated in a desired thickness by cold rolling, and a ratio of thicknesses of the intermediate layer and the external layer is 1 to 9:1;

stamping and heat treating, wherein the composite aluminum alloy plate P is stabilized in the tempering treatment T and a stamping treatment so produce the case of the electronic product; and anodizing the second aluminum alloy plate so as to produce an aluminum layer on an outer surface of the second aluminum alloy plate.

Preferably, the desired thickness of the composite aluminum alloy plate is 0.1 mm to 6.0 mm, a total elongation of the composite aluminum alloy plate is 5% to 25%, a tensile strength of the intermediate layer is 300 Mpa to 550 Mpa, and a tensile strength of the external layer is 100 Mpa to 150 Mpa.

Preferably, the tempering treatment T is a refining treatment T6 by which the composite aluminum alloy plate is hot rolled, cold rolled, and solution treated in the temperature of 480° C. to 520° C., and the composite aluminum alloy plate is aging treated for 24 hours within the temperature of 110° C. to 130° C.

Preferably, the refining manner T is a refining treatment T6 by which the composite aluminum alloy plate is hot rolled, cold rolled, and solution treated in the temperature of 480° C. to 520° C., and the composite aluminum alloy plate is aging treaded for 24 hours within the temperature of 110° C. to 130° C.

Preferably, in the step of stamping and heat treating, the composite aluminum alloy plate is solution treated, stamped and aging treated in turn.

Preferably, the first aluminum alloy plate is stamped after being aging treated in the step S2-4.

DETAILED DESCRIPTION OF THE PREFERRED EMBODIMENTS

Figure 1:
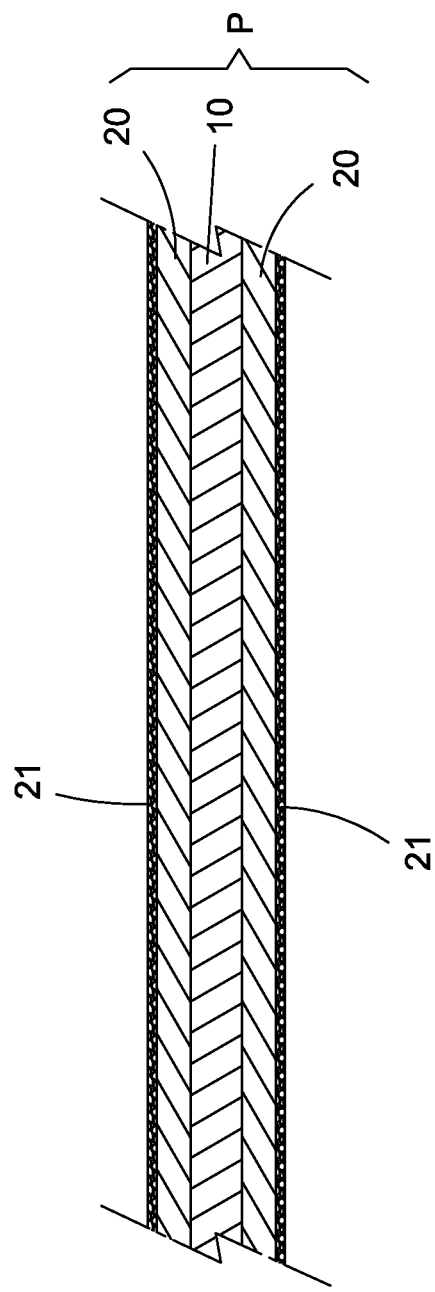
FIG. 1 is a cross sectional view showing a composite aluminum alloy plate for a case of an electronic product according to a preferred embodiment of the present invention.

With reference to FIG. 1, a composite aluminum alloy plate for a case of an electronic product according to a preferred embodiment of the present invention comprises: a first aluminum alloy plate 10 and a second aluminum alloy plate 20 which are stacked and compounded, wherein the first aluminum alloy plate 10 is made of first aluminum alloy material, and the second aluminum alloy plate 20 is made of second aluminum alloy material different from the first aluminum alloy material of the first aluminum alloy plate 10. For example, the first aluminum alloy material of the first aluminum alloy plate 10 is selected from any one of 6XXX series aluminum alloy to 8XXX series aluminum alloy, and the second aluminum alloy material of the second aluminum alloy plate 20 is selected from any one of 1XXX series aluminum alloy to 5XXX series aluminum alloy. The first aluminum alloy plate 10 and the second aluminum alloy plate 20 are stacked and compounded by hot rolling so as to produce the composite aluminum alloy plate P having an external layer, an intermediate layer, and an internal layer. The composite aluminum alloy plate P is laminated in a desired thickness by cold rolling and is stabilized in a tempering treatment T. The first aluminum alloy plate 10 is the intermediate layer of the composite aluminum alloy plate P, the second aluminum alloy plate 20 is the external layer of the composite aluminum alloy plate P, and a ratio of thicknesses of the intermediate layer and the external layer is 1 to 9:1, wherein the second aluminum alloy plate 20 includes an anodized aluminum layer 21 anodized on an outer surface thereof.

Figure 2:
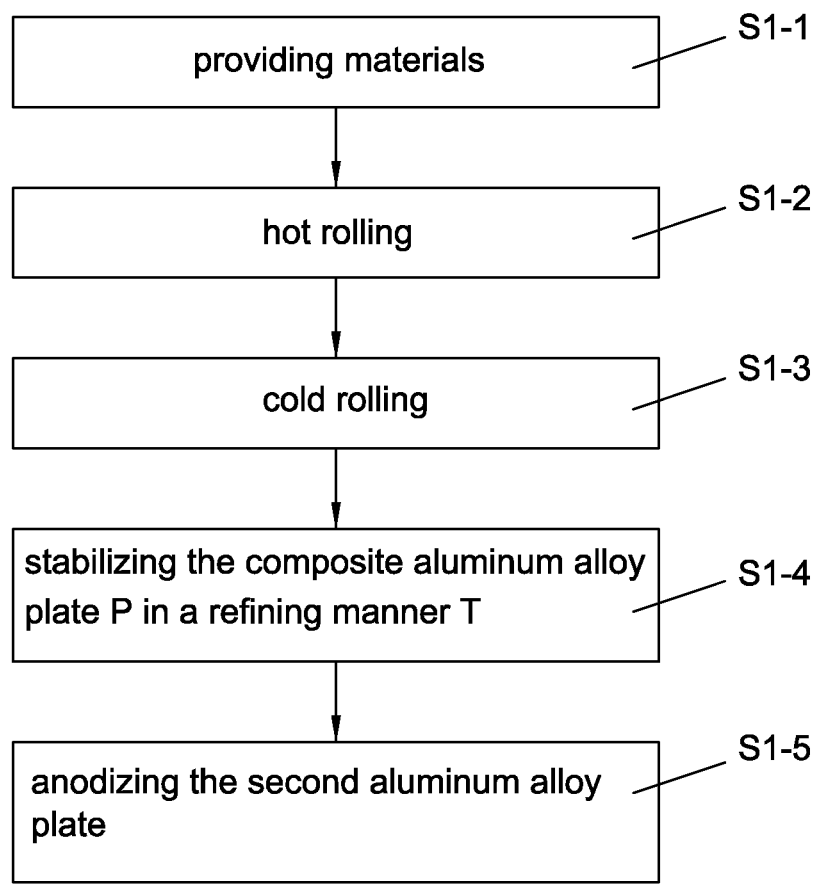
FIG. 2 is a flow chart of a method of making composite aluminum alloy plate according to the preferred embodiment of the present invention.

Referring to FIG. 2, a method of making composite aluminum alloy plate according to the preferred embodiment of the present invention comprises steps of:

S1-2) hot rolling, wherein the first aluminum alloy plate 10 and the second aluminum alloy plate 20 are stacked and compounded by hot rolling to produce the composite aluminum alloy plate P having the external layer, the intermediate layer, and the internal layer, wherein the first aluminum alloy plate 10 is the intermediate layer of the composite aluminum alloy plate P, and the second aluminum alloy plate 20 is the external layer of the composite aluminum alloy plate P;

S1-2) hot rolling, wherein the first aluminum alloy plate 10 and the second aluminum alloy plate 20 are stacked and compounded in a hot rolling manner to produce the composite aluminum alloy plate P having the external layer, the intermediate layer, and the internal layer, wherein the first aluminum alloy plate 10 is the intermediate layer of the composite aluminum alloy plate P, and the second aluminum alloy plate 20 is the external layer of the composite aluminum alloy plate P;

S1-3) cold rolling, wherein the composite aluminum alloy plate P is laminated in the desired thickness by cold rolling, wherein the ratio of thicknesses of the intermediate layer and the external layer is 1 to 9:1;

S1-4) stabilizing the composite aluminum alloy plate P in the tempering treatment T; and S1-5) anodizing the second aluminum alloy plate 20 so as to produce the aluminum layer 21 on the outer surface of the second aluminum alloy plate 20.

It is to be note that a hardness of the 1XXX series aluminum alloy to the 5XXX series aluminum alloy is less than a hardness of the 6XXX series aluminum alloy to the 8XXX series aluminum alloy.

Thereby, the composite aluminum alloy plate P has a stable mechanical property, brilliant tensile strength and elongation.

The desired thickness of the composite aluminum alloy plate P is 0.1 mm to 6.0 mm, a total elongation of the composite aluminum alloy plate P is 5% to 25%, a tensile strength of the intermediate layer is 300 Mpa to 550 Mpa, and a tensile strength of the external layer is 100 Mpa to 150 Mpa. Preferably, the first aluminum alloy plate 10 is the intermediate layer of the composite aluminum alloy plate P, and the first aluminum alloy material of the first aluminum alloy plate 10 is selected from any one of the 6XXX series aluminum alloy to the 8XXX series aluminum alloy so as to enhance mechanical strength of the case of the electronic product. Furthermore, the second aluminum alloy plate 20 is the external layer of the composite aluminum alloy plate P, the second aluminum alloy material of the second aluminum alloy plate 20 is selected from any one of the 1XXX series aluminum alloy to the 5XXX series aluminum alloy, and the second aluminum alloy plate 20 is anodized and dyed so as to enhance aesthetic appearance of the case of the electronic product.

In another embodiment, the first aluminum alloy plate 10 is 7075 aluminum alloy plate, and the second aluminum alloy plate 20 is 5052 aluminum alloy plate and is anodized and dye, wherein the hardness of the second aluminum alloy plate 20 is up to 6XXX series aluminum alloy so as to obtain chemical stability, insulation, high-temperature resistance, and abrasion resistance.

In another embodiment, the composite aluminum alloy plate P is stabilized by using a refining treatment T6, and the first aluminum alloy plate 10 is the 7075 aluminum alloy plate and is stabilized by using the refining treatment T6, wherein the composite aluminum alloy plate P is hot rolled, cold rolled, and solution treated in a temperature of 480° C. to 520° C. Thereafter, the composite aluminum alloy plate P is aging treated for 24 hours within a temperature of 110° C. to 130° C.

In another embodiment, a ratio of thicknesses of the intermediate layer and the external layer is 1 to 2:1, for example, the ratio of the thicknesses of the intermediate layer and the external layer is 1:1, such that the composite aluminum alloy plate P is stamped to enhance a quality of right-angled sides of the case of the electronic product. When the first aluminum alloy plate 10 is the 7075 aluminum alloy plate, a bending resistance and the mechanical strength of the case of the electronic product is enhanced.

Figure 3:
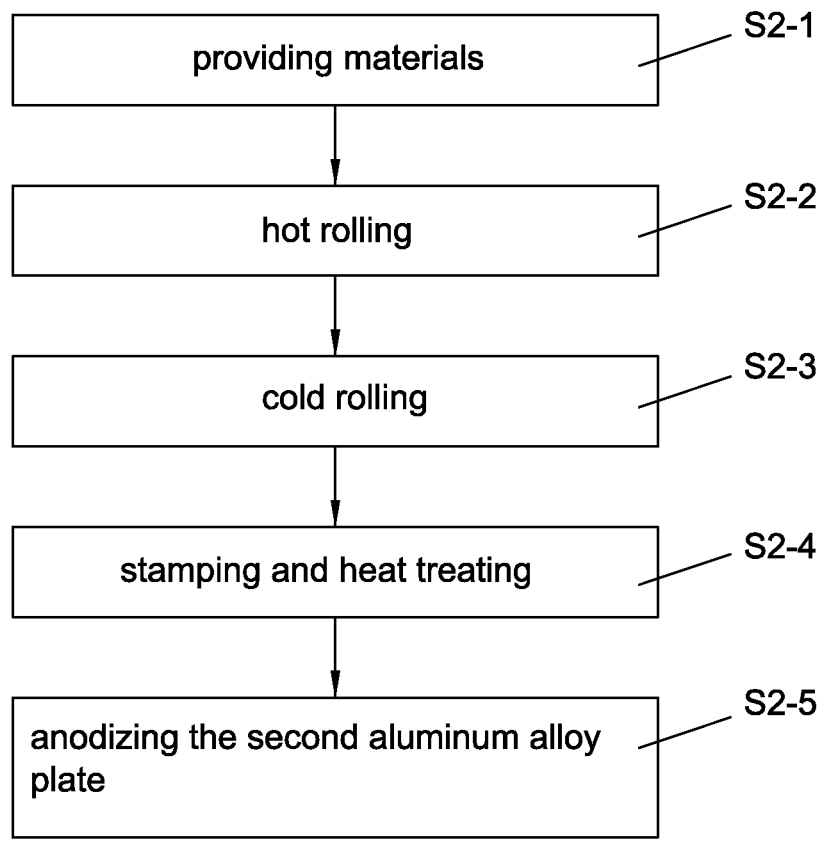
FIG. 3 is a flow chart of a method of making a case of an electronic product according to the preferred embodiment of the present invention.

As shown in FIG. 3, a method of making the case of the electronic product according to the preferred embodiment of the present invention comprises steps of:

S2-1) providing martials, wherein the first aluminum alloy material of the first aluminum alloy plate 10 and the second aluminum alloy material of the second aluminum alloy plate 20 are provided, wherein the first aluminum alloy material is selected from any one of the 6XXX series aluminum alloy to the 8XXX series aluminum alloy, and the second aluminum alloy material is selected from any one of the 1XXX series aluminum alloy to 5XXX series aluminum alloy;

S2-2) hot rolling, wherein the first aluminum alloy plate 10 and the second aluminum alloy plate 20 are stacked and compounded by hot rolling to produce the composite aluminum alloy plate P having the external layer, the intermediate layer, and the internal layer, wherein the first aluminum alloy plate 10 is the intermediate layer of the composite aluminum alloy plate P, and the second aluminum alloy plate 20 is the external layer of the composite aluminum alloy plate P;

S2-3) cold rolling, wherein the composite aluminum alloy plate P is laminated in the desired thickness by cold rolling, wherein the ratio of thicknesses of the intermediate layer and the external layer is 1 to 9:1;

S2-4) stamping and heat treating, wherein the composite aluminum alloy plate P is stabilized in the tempering treatment T and a stamping manner so produce the case of the electronic product; and S2-5) anodizing the second aluminum alloy plate 20 so as to produce the aluminum layer 21 on the outer surface of the second aluminum alloy plate 20.

The desired thickness of the composite aluminum alloy plate P is 0.1 mm to 6.0 mm, a total elongation of the composite aluminum alloy plate P is 5% to 25%, a tensile strength of the intermediate layer is 300 Mpa to 550 Mpa, and a tensile strength of the external layer is 100 Mpa to 150 Mp, wherein the first aluminum alloy plate 10 is the 7075 aluminum alloy plate, and the second aluminum alloy plate 20 is 5052 aluminum alloy plate.

In the step S2-4, the first aluminum alloy plate 10 is the 7075 aluminum alloy plate and is stabilized by using the refining treatment T6, wherein the composite aluminum alloy plate P is hot rolled, cold rolled, and solution treated in the temperature of 480° C. to 520° C. Thereafter, the composite aluminum alloy plate P is aging treaded treated for 24 hours within the temperature of 110° C. to 130° C., such that precipitation hardening of the first aluminum alloy plate 10 is stable.

In the step S2-4, the first aluminum alloy plate 10 is solution treated, stamped, and aging treated in turn so as to have stable mechanical property of the case of the electronic product.

In another embodiment, the first aluminum alloy plate 10 is stamped before after aging treated in the step S2-4 so as to have stable mechanical property of the case of the electronic product.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A composite aluminum alloy plate for a case of an electronic product comprising:
    a first aluminum alloy plate and a second aluminum alloy plate which are stacked and compounded, wherein the first aluminum alloy plate is made of first aluminum alloy material, and the second aluminum alloy plate is made of second aluminum alloy material different from the first aluminum alloy material of the first aluminum alloy plate;
    wherein the first aluminum alloy material of the first aluminum alloy plate is selected from any one of 6XXX series aluminum alloy to 8XXX series aluminum alloy, and the second aluminum alloy material of the second aluminum alloy plate is selected from any one of 1XXX series aluminum alloy to 5XXX series aluminum alloy;
    wherein the first aluminum alloy plate and the second aluminum alloy plate are stacked and compounded by hot rolling so as to produce the composite aluminum alloy plate having a first layer, a second layer, and a third layer, and the composite aluminum alloy plate is laminated in a desired thickness by cold rolling and is stabilized in a tempering treatment T;
    wherein the first aluminum alloy plate is the second layer of the composite aluminum alloy plate, the second aluminum alloy plate is the first layer of the composite aluminum alloy plate, and a ratio of thicknesses of the second layer and the first layer is 1 to 9:1;
    wherein the second aluminum alloy plate includes an anodized aluminum layer formed thereon, and the anodized aluminum layer is the third layer of the composite aluminum alloy plate;
    wherein the desired thickness of the composite aluminum alloy plate is 0.1 mm to 6.0 mm, a total elongation of the composite aluminum alloy plate is 5% to 25%, a tensile strength of the second layer is 300 Mpa to 550 Mpa, and a tensile strength of a first layer is 100 Mpa to 150 Mpa.

2. The composite aluminum alloy plate for the case of the electronic product as claimed in claim 1, wherein a ratio of thicknesses of the second layer and the a first layer is 1 to 2:1.

3. A composite aluminum alloy plate for a case of an electronic product comprising:
    a first aluminum alloy plate and a second aluminum alloy plate which are stacked and compounded, wherein the first aluminum alloy plate is made of first aluminum alloy material, and the second aluminum alloy plate is made of second aluminum alloy material different from the first aluminum alloy material of the first aluminum alloy plate;
    wherein the first aluminum alloy material of the first aluminum alloy plate is selected from any one of 6XXX series aluminum alloy to 8XXX series aluminum alloy, and the second aluminum alloy material of the second aluminum alloy plate is selected from any one of 1XXX series aluminum alloy to 5XXX series aluminum alloy;
    wherein the first aluminum alloy plate and the second aluminum alloy plate are stacked and compounded by hot rolling so as to produce the composite aluminum alloy plate having a first layer, a second layer, and a third layer, and the composite aluminum alloy plate is laminated in a desired thickness by cold rolling and is stabilized in a tempering treatment T;
    wherein the first aluminum alloy plate is the second layer of the composite aluminum alloy plate, the second aluminum alloy plate is the first layer of the composite aluminum alloy plate, and a ratio of thicknesses of the second layer and the first layer is 1 to 9:1;
    wherein the second aluminum alloy plate includes an anodized aluminum layer formed thereon, and the anodized aluminum layer is the third layer of the composite aluminum alloy plate;
    wherein the first aluminum alloy plate is 7075 aluminum alloy plate, and the second aluminum alloy plate is 5052 aluminum alloy plate; wherein the desired thickness of the composite aluminum alloy plate is 0.1 mm to 6.0 mm, a total elongation of the composite aluminum alloy plate is 5% to 25%, a tensile strength of the second layer is 300 Mpa to 550 Mpa, and a tensile strength of the a first layer is 100 Mpa to 150 Mpa.

4. The composite aluminum alloy plate for the case of the electronic product as claimed in claim 3, wherein the tempering treatment T is a refining treatment T6 by which the composite aluminum alloy plate is hot rolled, cold rolled, and solution treated in the temperature of 480° C. to 520° C., and the composite aluminum alloy plate is aging treated for 24 hours within the temperature of 110° C. to 130° C.

* * * * *